United States Patent
Chae et al.

(10) Patent No.: US 7,994,835 B2
(45) Date of Patent: Aug. 9, 2011

(54) DUTY CONTROL CIRCUIT AND SEMICONDUCTOR DEVICE HAVING THE SAME

(75) Inventors: Kwan-yeob Chae, Seoul (KR); Su-ho Kim, Yongin-si (KR); Won Lee, Gunpo-si (KR); Sang-hoon Joo, Yongin-si (KR); Dharmendra Pandit, Yongin-si (KR); Jong-ryun Choi, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 16 days.

(21) Appl. No.: 12/585,680

(22) Filed: Sep. 22, 2009

(65) Prior Publication Data

US 2010/0073059 A1 Mar. 25, 2010

(30) Foreign Application Priority Data

Sep. 22, 2008 (KR) .................. 10-2008-0092944

(51) Int. Cl.
*H03K 3/017* (2006.01)
(52) U.S. Cl. ..................... 327/175; 327/172
(58) Field of Classification Search .............. None
See application file for complete search history.

(56) References Cited

U.S. PATENT DOCUMENTS

| | | | |
|---|---|---|---|
| 5,959,481 A * | 9/1999 | Donnelly et al. | 327/170 |
| 6,670,838 B1 | 12/2003 | Cao | |
| 6,897,696 B2 | 5/2005 | Chang | |
| 7,565,468 B2 * | 7/2009 | Horowitz et al. | 710/104 |
| 2004/0221188 A1 * | 11/2004 | Lau et al. | 713/400 |
| 2008/0169855 A1 | 7/2008 | Shin et al. | |

FOREIGN PATENT DOCUMENTS

KR 10-2007-0121179 A 12/2007

* cited by examiner

*Primary Examiner* — Cassandra Cox
(74) *Attorney, Agent, or Firm* — Lee & Morse, P.C.

(57) ABSTRACT

A duty control circuit including a clock input unit connected to a first node and a second node, the clock input unit receiving an input clock signal through the first node and changing a voltage of the second node to one of a first voltage level and a second voltage level in response to respective low and high logic levels of the input clock signal, a slew controller connected to the second node, the slew controller including one or more switches controlled by respective control signals, the one or more switches providing one of the first voltage level and the second voltage level to the second node in response to the control signals such that a slew rate of a signal at the second node is varied, and a clock output unit, the clock output unit outputting an output clock signal having a duty that varies.

17 Claims, 8 Drawing Sheets

DUTY CONTROL CIRCUIT AND SEMICONDUCTOR DEVICE HAVING THE SAME

BACKGROUND

1. Field

Embodiments relate to a clock signal duty control circuit and a semiconductor device having the same.

2. Description of the Related Art

The precision of a duty of a clock signal is an important consideration for high-speed, i.e., high clock-rate, semiconductor devices. For example, if a semiconductor device is a double data rate (DDR) synchronous dynamic random access memory (SDRAM), the semiconductor device operates using both a rising edge and a falling edge of a clock signal. Thus, if a duty of a clock signal varies, the semiconductor device may malfunction.

A duty control circuit may be implemented to control a duty of a clock signal, e.g., using a delay of a buffer. However, if the amount of the delay of the buffer varies, e.g., increases, precise control of the duty of the clock signal may be difficult or impossible.

SUMMARY

Embodiments are directed to a clock signal duty control circuit and a semiconductor device having the same, which substantially overcome one or more problems due to the limitations and disadvantages of the related art.

It is therefore a feature of an embodiment to provide a duty control circuit configured to control a duty of a clock signal by controlling the slew rate of rising and/or falling edges of the clock signal.

It is therefore another feature of an embodiment to provide a semiconductor device having a duty control circuit.

At least one of the above and other features and advantages may be realized by providing a duty control circuit configured to control duty of a clock signal, the duty control circuit including a clock input unit connected to a first node and a second node, the clock input unit receiving an input clock signal through the first node and changing a voltage of the second node to one of a first voltage level and a second voltage level in response to respective low and high logic levels of the input clock signal, a slew controller connected to the second node, the slew controller including one or more switches controlled by respective control signals, the one or more switches providing one of the first voltage level and the second voltage level to the second node in response to the control signals such that a slew rate of a signal at the second node is varied, and a clock output unit, the clock output unit outputting an output clock signal having a duty that varies in accordance with the slew rate of the signal at the second node.

The clock input unit may include an inverter that inverts the input clock signal received through the first node and outputs an inverted signal to the second node.

The first voltage level may be provided by a power voltage source, and the second voltage level is provided a ground voltage source.

The one or more switches may include a plurality of switches that are connected in parallel between the power voltage source and the second node, and, when the input clock signal transitions from logic high to logic low, the plurality of switches may be selectively turned on in response to the control signals so as to provide the first voltage level to the second node.

The plurality of switches may include respective PMOS transistors having sizes that are different from one another, and the PMOS transistors may be selectively turned on in response to the control signals to provide the first voltage level to the second node so as to control a rising slew rate of the signal at the second node.

The one or more switches may include a plurality of switches that are connected in parallel between the ground voltage source and the second node, and, when the input clock signal transitions from logic low to logic high, the plurality of switches may be selectively turned on in response to the control signals so as to provide the second voltage level to the second node.

The plurality of switches may include respective NMOS transistors having sizes that are different from one another, and the NMOS transistors may be selectively turned on in response to the control signals to provide the second voltage level to the second node so as to control a falling slew rate of the signal at the second node.

The slew controller may include an "n" (where "n" is a positive integer) number of first switches that include first electrodes receiving the first voltage level, the first switches being controlled by the input clock signal, and an "n" number of second switches that are connected between second electrodes of the "n" number of first switches and the second node, and which may selectively connect the second electrodes of the "n" number of first switches to the second node, each of the "n" number of second switches being switched on in response to a corresponding control signal so as to provide the first voltage level to the second node.

The "n" number of first switches may include respective $1^{st}$ through $n^{th}$ PMOS transistors that are arranged in parallel and are switched in response to the input clock signal, and the "n" number of second switches may include respective $(n+1)^{th}$ through $2n^{th}$ PMOS transistors that are respectively connected to the $1^{st}$ through $n^{th}$ PMOS transistors, the $(n+1)^{th}$ through $2n^{th}$ PMOS transistors being switched respectively in response to $1^{st}$ through $n^{th}$ control signals.

The $1^{st}$ through $n^{th}$ PMOS transistors may have sizes that are different from one another, the $(n+1)^{th}$ through $2n^{th}$ PMOS transistors may have sizes respectively corresponding to the different sizes of the $1^{st}$ through $n^{th}$ PMOS transistors, and the slew controller may control a rising slew rate of the signal at the second node in response to the $1^{st}$ through $n^{th}$ control signals.

The slew controller may include an "n" (where "n" is a positive integer) number of first switches that include first electrodes receiving the second voltage level, the first switches being controlled by the input clock signal, and an "n" number of second switches that are connected between second electrodes of the "n" number of first switches and the second node, and which selectively connect the second electrodes of the "n" number of first switches to the second node, each of the "n" number of second switches being switched in response to a corresponding control signal so as to provide the second voltage level to the second node.

The "n" number of first switches may include respective $1^{st}$ through $n^{th}$ NMOS transistors that are arranged in parallel and are switched in response to the input clock signal, and the "n" number of second switches may include respective $(n+1)^{th}$ through $2n^{th}$ NMOS transistors that are respectively connected to the $1^{st}$ through $n^{th}$ NMOS transistors, the $(n+1)^{th}$ through $2n^{th}$ NMOS transistors being switched respectively in response to $1^{st}$ through $n^{th}$ control signals.

The $1^{st}$ through $n^{th}$ NMOS transistors may have sizes that are different from one another, the $(n+1)^{th}$ through $2n^{th}$ NMOS transistors may have sizes respectively corresponding to the different sizes of the 1$^{st}$ through n$^{th}$ NMOS transistors, and the slew controller may control a falling slew rate of the signal at the second node in response to the 1$^{st}$ through n$^{th}$ control signals.

The duty control circuit may further include a control signal generator. The control signal generator may generate the control signals, the control signal generator may provide control signals to the slew controller so as to control the slew rate of the signal at the second node, and the clock output unit may receive the signal from the second node and generates the output clock signal.

The duty control circuit may further include a duty detector that receives the output clock signal, detects the duty of the output clock signal, and provides a detection result to the control signal generator so that the slew rate of the signal at the second node is controlled in response to the duty of the output clock signal.

At least one of the above and other features and advantages may also be realized by providing a duty control circuit configured to control duty of a clock signal, the duty control circuit including a first clock input unit connected to a first node and a second node, the first clock input unit receiving an input clock signal from the first node and transmitting a first signal to the second node in response to the input clock signal, a first slew controller connected to the second node and having a plurality of first switches receiving a first voltage level, the plurality of first switches being selectively switched in response to a plurality of first control signals so as to transmit the first voltage level to the second node through the first switches that have been selectively switched, such that a rising slew rate of the first signal at the second node is varied, a second clock input unit connected to the second node and a third node, the second clock input unit receiving the first signal from the second node and transmitting a second signal to the third node in response to the first signal of the second node, a second slew controller connected to third node and having a plurality of second switches receiving a second voltage level, the plurality of second switches being selectively switched in response to a plurality of second control signals so as to transmit the second voltage level to the third node through the second switches that have been selectively switched, such that a falling slew rate of the second signal at the third node is varied, and a clock output unit, the clock output unit outputting an output clock signal having a duty that varies in accordance with the rising and falling slew rates of the second signal at the third node.

The duty control circuit may further include a control signal generator. The clock output unit may receive the second signal of the third node and generate the output clock signal having a controlled duty, and the control signal generator may generate the first control signals for controlling the rising slew rate of the first signal and the second control signals for controlling the falling slew rate of the second signal.

The duty control circuit may further include a duty detector connected to a fourth node, the duty detector receiving the output clock signal from the fourth node, detecting the duty of the output clock signal, and providing the detection result to the control signal generator so that a slew rate of the signal at least one of the second and third nodes is controlled in response to the duty of the output clock signal.

At least one of the above and other features and advantages may also be realized by providing a semiconductor device having a duty control circuit that controls a duty of a clock signal, the duty control circuit including a clock input unit connected to a first node and a second node, the clock input unit receiving an input clock signal through the first node and changing a voltage of the second node to one of a first voltage level and a second voltage level in response to respective low and high logic levels of the input clock signal, a slew controller connected to the second node, the slew controller including one or more switches controlled by respective control signals, the one or more switches providing one of the first voltage level and the second voltage level to the second node in response to the control signals such that a slew rate of a signal at the second node is varied, and a clock output unit, the clock output unit outputting an output clock signal having a duty that varies in accordance with the slew rate of the signal at the second node.

When the input clock signal transitions from logic high to logic low, the one or more switches may be selectively turned on in response to the control signals and provide the first voltage level to the second node, and, when the input clock signal transitions from logic low to logic high, the one or more switches may be selectively turned on in response to the control signals and provide the second voltage level to the second node.

BRIEF DESCRIPTION OF THE DRAWINGS

The above and other features and advantages will become more apparent to those of skill in the art by describing in detail example embodiments with reference to the attached drawings, in which.

DETAILED DESCRIPTION

Figure 1:
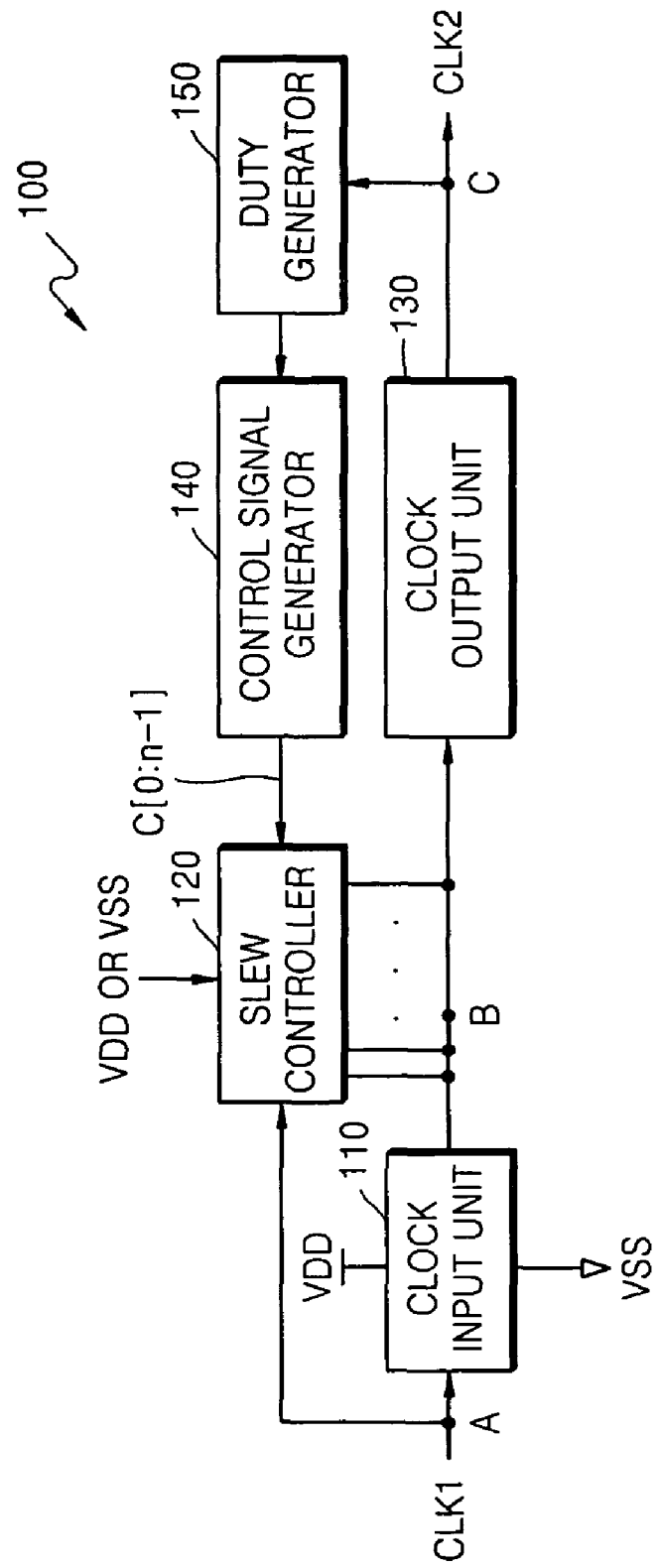
FIG. 1 illustrates a block diagram of a duty control circuit according to a first embodiment.

Korean Patent Application No. 10-2008-0092944, filed on Sep. 22, 2008, in the Korean Intellectual Property Office, and entitled: "Duty Control Circuit and Semiconductor Device Having the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art. In the drawing figures, the dimensions of layers and regions may be exaggerated for clarity of illustration. Like reference numerals refer to like elements throughout.

As used herein, the term "directly connected" means that two elements are connected to one another with no intervening elements, whereas the term "connected" means that the two elements may be directly connected or intervening elements may be present.

As used herein, the terms "duty cycle," "clock duty," and "duty of a clock signal," refer to a time spans (or a level width of the clock) of high and low logic levels of a clock signal. Thus, a clock signal having a "50% duty cycle" has equal time spans (or a level width of the clock) at the high and low logic levels. The time spans (or a level width of the clock) may be determined with reference to the voltage at which the clock signal voltage is half-way between the high-level voltage and the low-level voltage. Herein, shortening the clock duty means reducing the amount of time at which the clock signal is high, relative to the amount of time for which the clock signal is low. Thus, herein, a duty cycle of less than 50% means that the time at high logic level is less than the time at low logic level.

As used herein, the terms "slew" and "slew rate" refer to the maximum rate of change of the clock signal. Thus, the terms "rising slew rate" and "rising edge slew rate" refer to the maximum change in voltage/time (or a slope of the transition) of the rising edge of the clock signal, where the rising edge is a transition from the low-level voltage to the high-level voltage. Similarly, the terms "falling slew rate" and "falling edge slew rate" refer to the maximum change in voltage/time (or a slope of the transition) of the falling edge of the clock signal, where the falling edge is a transition from the high-level voltage to the low-level voltage.

FIG. 1 illustrates a block diagram of a duty control circuit 100 according to a first embodiment. The duty control circuit 100 may be installed in a semiconductor device and may control a duty of a clock signal by controlling the slew rate of rising and/or falling edges of the clock signal. The duty control circuit 100 may provide improved precision in regulation of the clock signal. Further, the duty control circuit 100 may provide programmable duty control.

Referring to FIG. 1, the duty control circuit 100 may include a clock input unit 110 and a slew controller 120. The clock input unit 110 may be coupled between a first node "A" and a second node "B," and may receive an input clock signal "CLK1" through the first node "A." As explained in detail below, the clock input unit 110 may provide the second node "B" with a voltage having a first level or a voltage having a second level in accordance to the input clock signal "CLK1." The voltage having the first level may be, e.g., a power voltage "VDD," and the voltage having the second level may be, e.g., a ground voltage "VSS." The clock input unit 110 may invert the input clock signal "CLK1" and thereby output a signal having a waveform opposite to that of the clock signal "CLK1" to the second node "B."

The slew controller 120 may include one or more switches (not shown in FIG. 1). As described in detail below, the one or more switches may be connected to the voltage having the first level (e.g., the power voltage "VDD"). Further, as explained in detail below, the slew controller 120 may include one or more switches connected to the voltage having the second voltage (e.g., the ground voltage "VSS"). A control signal, referred to herein as "C[0:n−1]," may be provided to control the one or more switches of the slew controller 120, so as to selectively switch the one or more switches. One or more switches may be on simultaneously. The one or more switches may be turned on depending on a state of the control signal "C[0:n−1]," and the voltage having the first level (or the voltage having the second level) may be transmitted to the second node "B" through the switches that have been turned on.

As the input clock signal "CLK1" transitions from logic high to logic low at the first node "A", a corresponding inverted voltage at the second node "B" increases from low to high, e.g., from the ground voltage "VSS" to the power voltage "VDD" at the second node "B," in response to the input clock signal "CLK1." At this time, the power voltage "VDD" may be provided to the second node "B" through one or more voltage paths through the corresponding one or more switches, i.e., by selective switching operations of the one or more switches of the slew controller 120. If the power voltage "VDD" is provided to the second node "B" through a large number of voltage paths, a rising slew rate of the voltage of the second voltage "B" may be increased, i.e., the first voltage may be applied to pull up the rising edge of the clock signal. Thus, the rising slew rate of the voltage of the second node "B" may be controlled by the switching operations of the one or more switches of the slew controller 120.

The slew controller 120 may work in corresponding fashion to pull down the falling edge of the clock signal. As the input clock signal "CLK1" transitions from logic low to logic high on the first node "A," the inverted voltage of the second node "B" may fall from the power voltage "VDD" to the ground voltage "VSS" in response to the input clock signal "CLK1." The slew controller 120 may be connected to the ground voltage "VSS," and the ground voltage "VSS" may be provided to the second node "B" through one or more voltage paths corresponding to the one or more switches due to the selective switching operations of the one or more switches of the slew controller 120. If the ground voltage "VSS" is provided to the second node "B" through a large number of voltage paths, a falling slew rate of the voltage of the second node "B" increases, i.e., the falling edge of the clock signal may be pulled down. Thus, the falling slew rate of the voltage of the second voltage "B" may be controlled by the switching operations of the one or more switches of the slew controller 120.

As described below in detail in connection with FIG. 2, multiple switches of the slew controller 120 may be arranged in parallel for the control of the slew rates. For example, the slew controller 120 may control the rising slew rate of the voltage of the second node "B" using two or more switches are arranged in parallel between the power voltage "VDD" and the second node "B." When the input clock signal "CLK1" transitions from logic high to logic low on the first node "A," the parallel-connected switches may be turned on, either individually or in combination, in accordance with the value of the control signal "C[0:n−1]" provided to the parallel-connected switches. The rising slew rate of the voltage of the second node "B" may controlled by connecting the power voltage "VDD" to the second node "B" via the switches that have been selectively turned on.

In complementary fashion, as described below in connection with FIG. 4, the slew controller 120 may control the falling slew rate of the voltage of the second node "B" using two or more switches arranged in parallel between the ground voltage "VSS" and the second node "B." When the input clock signal "CLK1" transitions from logic low to logic high, the parallel-connected switches may be selectively turned on in accordance with the value of the control signal "C[0:n−1]" provided to the parallel-connected switches. The falling slew rate of the voltage of the second node "B" may thus be controlled by connecting the ground voltage "VSS" to the second node "B" via the switches that have been selectively turned on. As described below in connection with FIGS. 3 and 5, pulling up the rising edge of the clock signal and/or pulling down the falling edge of the clock signal may affect the slew rate and, thus, the duty of the clock signal.

Referring again to FIG. 1, the duty control circuit 100 according to the first embodiment may further include a clock output unit 130, a control signal generator 140, and a duty detector 150. The clock output unit 130 may include, e.g., an inverter or a buffer. The clock output unit 130 may receive the voltage of the second node "B," invert or buffer the received voltage, and generate the inverted or buffered signal as an output clock signal "CLK2" having a controlled duty. The logic levels of the output clock signal "CLK2" may match those of the input clock signal "CLK1." The control signal generator 140 may generate the control signal "C[0:n−1]" for controlling operations of the one or more switches of the slew controller 120, and may provide the control signal "C[0:n−1]" to the slew controller 120.

The duty of the output clock signal "CLK2" generated by the clock output unit 130 may be detected in order to provide feedback, such that the rising slew rate and/or the falling slew rate of the second node "B" may be re-controlled (depending on the detection result of the duty) so as to correct the duty, if needed, by varying one or both of the rising and falling slew rates. For example, the duty detector 150 may receive the output clock signal "CLK2" from a third node "C" connected to an output port of the clock output unit 130, detects the duty of the output clock signal "CLK2" at the third node "C," and provide the detection result to the control signal generator 140. The control signal generator 140 may vary the value of the control signal "C[0:n−1]" based on the detection result of the duty.

A detailed operation of the duty control circuit 100 having the above-described structure will now be described with reference to FIGS. 2 through 5.

Figure 2:
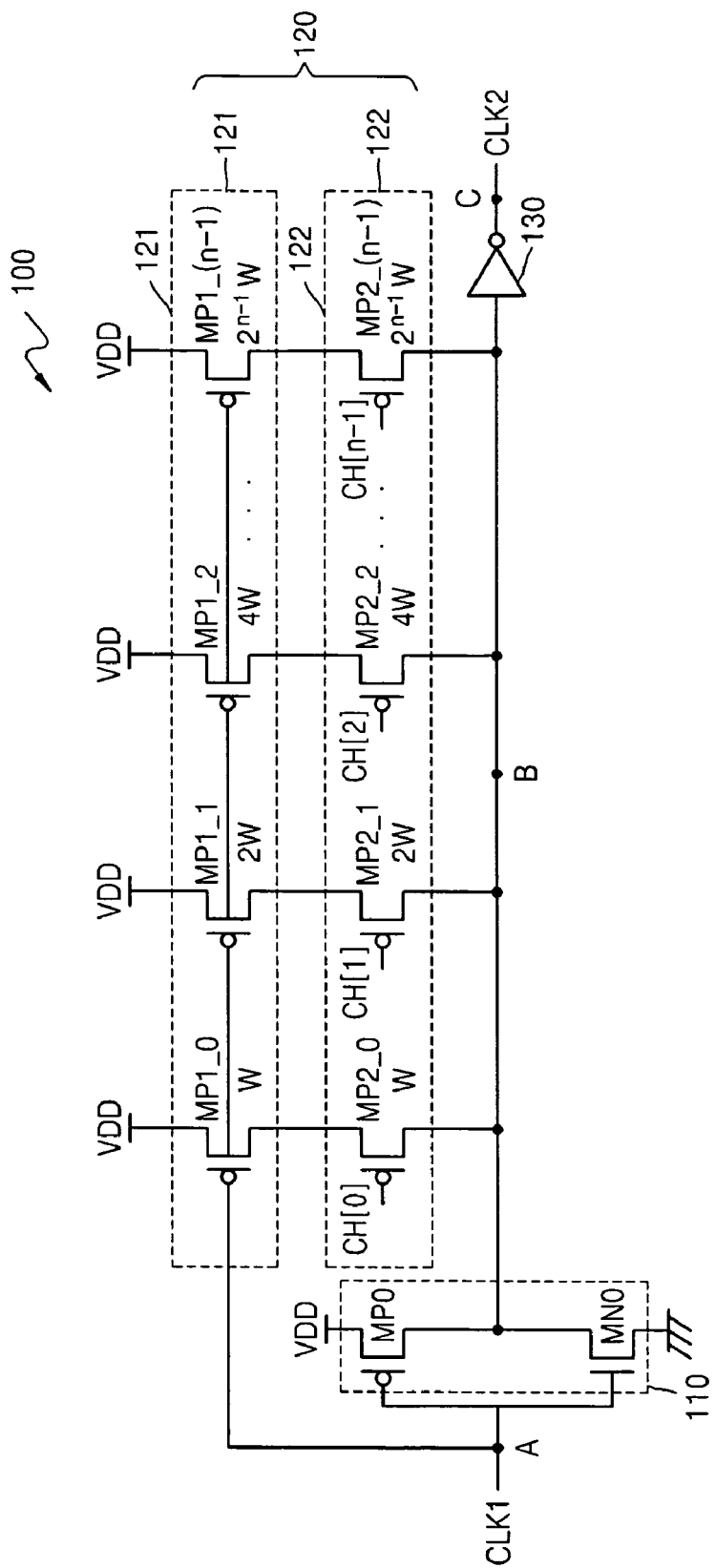
FIG. 2 illustrates a circuit diagram of the duty control circuit of FIG. 1.

FIG. 2 is a circuit diagram of the duty control circuit 100, according to an embodiment. In particular, the duty control circuit 100 of FIG. 2 increases the rising slew rate of the voltage of the second node "B" for a control of a duty. It will be appreciated that the exact placement of the second node "B" may be moved between the clock input unit 110 and the clock output unit 130, and is not limited to the particular position illustrated in FIG. 2.

Referring to FIG. 2, the duty control circuit 100 includes the clock input unit 110, the slew controller 120, and the clock output unit 130. The duty control circuit 100 may further include a control signal generator and a duty detector as shown in FIG. 1; however, illustrations of the control signal generator and the duty detector are omitted from FIG. 2 for clarity.

The clock input unit 110 includes an inverter which includes a p-channel metal-oxide semiconductor (PMOS) transistor "MP0" connected to the power voltage "VDD" and an n-channel metal-oxide semiconductor (NMOS) transistor "MN0" connected to the ground voltage "VSS." The clock input unit 110 inverts and outputs the input clock signal "CLK1." For example, if the input clock signal "CLK1" transitions from logic high to logic low, the power voltage "VDD" is provided to the second node "B." If the input clock signal "CLK1" transitions from logic low to logic high, the ground voltage "VSS" is provided to the second node "B."

The slew controller 120 includes the one or more switches, e.g., an integer "n" number of first switches 121 and an integer "n" number of second switches 122. The integer "n" may be one or more. The "n" number of the first switches 121 may include, e.g., first through $n^{th}$ PMOS transistors "MP1_0" through "MP1_(n−1)." First electrodes of the "n" number of first switches 121 may receive power by being connected to the power voltage "VDD," and, when in the "on" state, may supply the power to the second switches 122. The "n" number of first switches 121 may be commonly controlled by the input clock signal "CLK1," e.g., by receiving the input clock signal "CLK1" at the gates thereof.

The "n" number of second switches 122 include $(n+1)^{th}$ through $2n^{th}$ PMOS transistors "MP2_0" through MP2_(n−1)" which are connected between second electrodes of the "n" number of first switches 121 and the second node "B." A "n" number of control signals "CH[0]" through "CH[n−1]" are separately controlled and respectively transmitted to the "n" number of second switches 122, and the $(n+1)^{th}$ through $2n^{th}$ PMOS transistors "MP2_0" through "MP2_(n−1)" of the "n" number of second switches 122 are respectively switched by the corresponding control signals "CH[0]" through "CH[n−1]." For example, the $(n+1)^{th}$ PMOS transistor is switched by the control signal "CH[0]," and the $(n+2)^{th}$ PMOS transistor is switched by the control signal "CH[1]."

Figure 3:
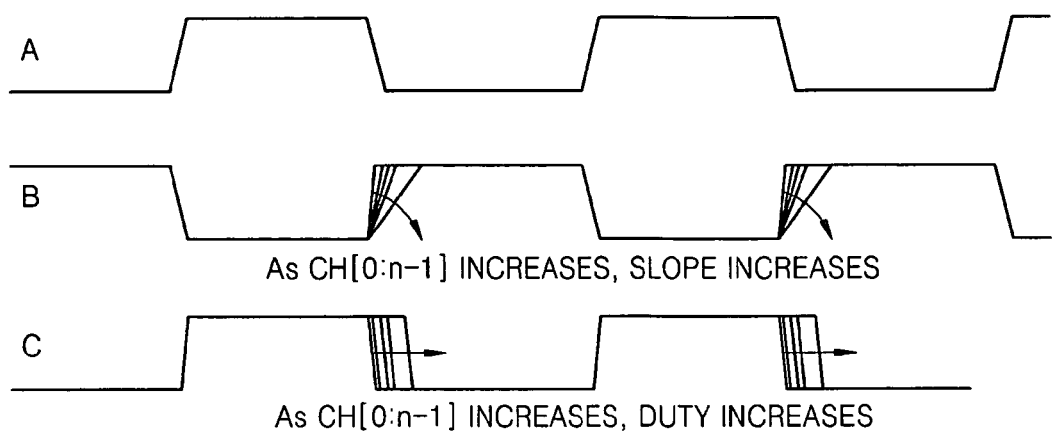
FIG. 3 illustrates waveforms explaining an operation of the duty control circuit of FIG. 2.

FIG. 3 illustrates waveforms explaining an operation of the duty control circuit 100 of FIG. 2. The operation of the duty control circuit 100 of FIG. 2 will now be described with reference to FIG. 3.

When the level of the voltage of the first node "A" goes high due to a transition of the input clock signal "CLK1" from logic low to logic high, the "n" number of first switches 121 in FIG. 2 may be turned off in response to the input clock signal "CLK1." Thus, the power voltage "VDD" may be cut off from the second node "B" by the slew controller 120, regardless of states of the control signals "CH[0]" through "CH[n−1]," i.e., regardless of the on/off states of the second switches 122.

When the level of the voltage of the first node "A" goes low to a transition of the input clock signal "CLK1" from logic high to logic low, the "n" number of first switches 121 may be turned on in response to the input clock signal "CLK1." Additionally, the $(n+1)^{th}$ through $2n^{th}$ PMOS transistors "MP2_0" through MP2_(n−1))" may be respectively selectively switched in response to states of the control signals "CH[0]" through "CH[n−1]" (which may correspond to predetermined bits of the control signal "C[0:n−1]"). Thus, the power voltage "VDD" may be provided to the second node "B," through the second switches of the "n" number of second switches 122 which have been turned on, so as to affect the rising slew rate.

In an implementation, the sizes, e.g., areas, of PMOS transistors of the "n" number of first switches 121 may be different from one another, and the sizes of PMOS transistors of the "n" number of second switches 122 may be different from one another. For example, as shown in FIG. 2, areas of the first through $n^{th}$ PMOS transistors "MP1_0" through "MP1_(n−1)" of the "n" number of first switches 121 may respectively have values of "W," "2W," "4W," . . . , and "$2^{n-1}$W." Similarly, areas of the $(n+1)^{th}$ through $2n^{th}$ PMOS transistors "MP2_0" through MP2_(n−1))" of the "n" number of second switches 122 may respectively have values of "W," "2W," "4W," . . . , and "$2^{n-1}$W." Thus, the turn-on resistance values of each of the "n" number of first switches 121 and the "n" number of second switches 122 may be controlled in steps, i.e., increments, thus providing for programmability. For example, the rising slew rate of the voltage of the second node "B" may be controlled as $2^{n-1}$ using switches that are turned on in combination.

For example, if values of the "n" number of control signals "CH[0]" through "CH[n−1]" are all zeros ("000 . . . 00"), then all of the $(n+1)^{th}$ through $2n^{th}$ PMOS transistors "MP2_0" through "MP2_(n−1)" may be turned on. Thus, the power voltage "VDD" may be provided to the second node "B" through all of paths corresponding to the $(n+1)^{th}$ through $2n^{th}$ PMOS transistors "MP2_0" through "MP2_(n−1)". As a result, the rising slew rate of the second node "B" may be increased. The clock output unit 130 may invert the voltage of the second node "B" and generate the inverted voltage as the output clock signal "CLK2." As shown by the example waveform of a third node "C" (at the output of the clock output unit 130) that is shown in FIG. 3, the duty of the output clock signal "CLK2" may decrease with an increase in the rising slew rate of the second node "B," i.e., the increase in rising slew rate may effectively shorten the transition time from low to high at the second node "B." This may thereby increase the time during which the signal is high at the second node "B" and correspondingly decrease the time during which the inverted signal output on the third node "C" as clock signal "CLK2" is high, such that the clock duty is shortened.

If the values of the "n" number of controls signals "CH[0]" through "CH[n−1]" are all high ("111 . . . 11"), then all of the $(n+1)^{th}$ through $2n^{th}$ PMOS transistors "MP2_0" through "MP2_(n−1)" may be turned off. Thus, the power voltage "VDD" may be cut off from the second node "B" by the $(n+1)^{th}$ through $2n^{th}$ PMOS transistors "MP2_0" through MP2_(n−1))", and the rising slew rate of the second node "B" may decrease. Like the waveform of the third node "C" shown in FIG. 3, the duty of the output clock signal "CLK2" may increase with the decrease in the rising slew rate of the second node "B".

The "n" number of controls signals "CH[0]" through "CH[n−1]" may vary to numbers of $2^{n-1}$, and thus the rising slew rate of the second node "B" may vary to numbers of $2^{n-1}$. As the values of the "n" number of controls signals "CH[0]" through "CH[n−1]" increase from "000 . . . 00" to "111 . . . 11," the rising slew rate of the second node "B" gradually decreases due to the reduction in pull-up effect, and the duty of the output clock signal "CLK2" increase in $2^{n-1}$ increments, i.e., $2^{n-1}$ steps.

As described above, the duty control circuit 100 according to this embodiment of the inventive concept programmably and precisely controls a duty of a clock signal by degrees. In particular, the duty control circuit 100 controls a slew of a falling edge of the output clock signal "CLK2" to control the duty. Thus, the duty control circuit 100 prevents variations in clock latency in a semiconductor device that are caused by variations in a rising edge of a clock.

Figure 4:
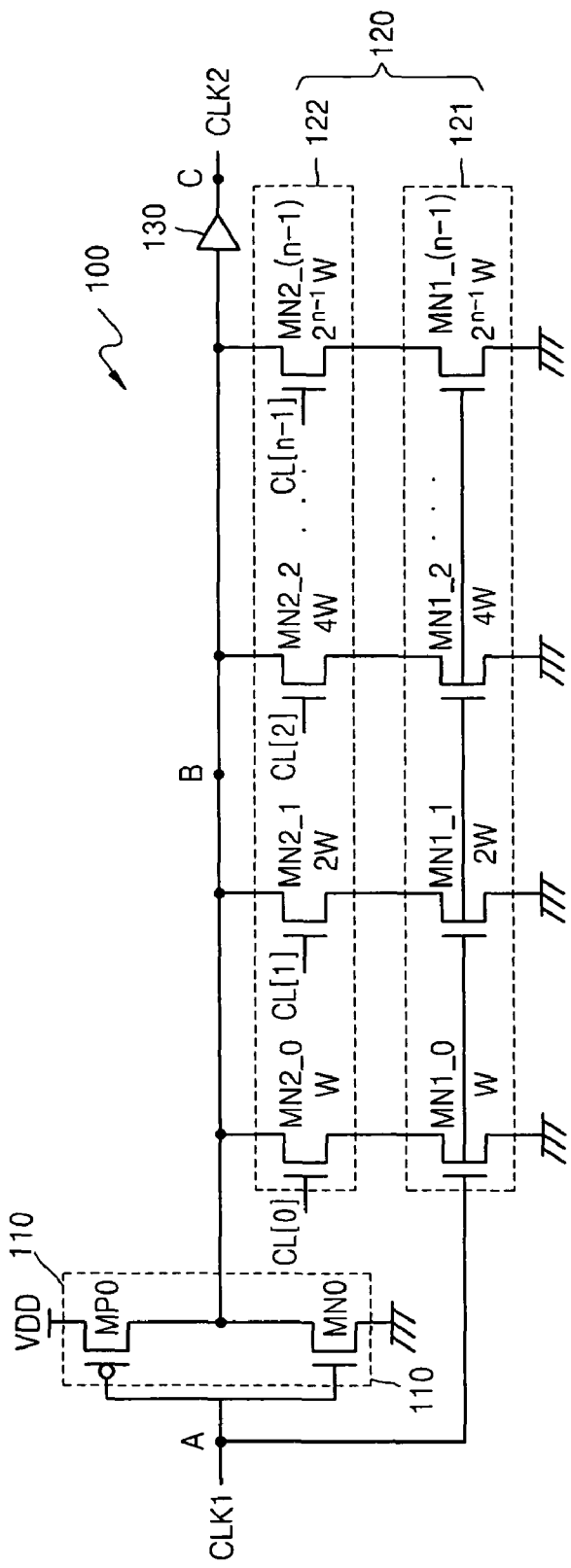
FIG. 4 illustrates another circuit diagram of the duty control circuit of FIG. 1.

FIG. 4 illustrates another circuit diagram of the duty control circuit 100 of FIG. 1. The duty control circuit 100 of FIG. 4 may increase the falling slew rate of the voltage of the second node "B" and thus control a duty of an output clock signal.

As shown in FIG. 4, the duty control circuit 100 may include the clock input unit 110, the slew controller 120, and the clock output unit 130. The clock output unit 110 may include an inverter that inverts and outputs the input clock signal "CLK1" provided through the first node "A," and the clock output unit 130 may include a buffer that buffers the voltage of the second node "B" and provides the buffered voltage as the output clock signal "CLK2."

The slew controller 120 may include an "n" number of first switches 121 and an "n" number of second switches 122. The "n" number of first switches 121 may include respective first through $n^{th}$ NMOS transistors "MN1_0" through "MN1_(n−1)." First electrodes of the "n" number of first switches 121 may be connected to the ground voltage "VSS," and the "n" number of first switches 121 may be commonly controlled by the input clock signal "CLK1." The "n" number of second switches 122 may include $(n+1)^{th}$ through $2n^{th}$ NMOS transistors "MN2_0" through "MN2_(n−1)" that are respectively connected between second electrodes of the "n" number of first switches 121 and the second node "B." A "n" number of control signals "CL[0]" through "CL[n−1]" may be separately controlled and respectively provided to the "n" number of second switches 122, and the $(n+1)^{th}$ through $2n^{th}$ NMOS transistors "MN2_0" through "MN2_(n−1)" of the "n" number of second switches 122 may be respectively selectively switched in response to the control signals "CL[0]" through "CL[n−1]."

Figure 5:
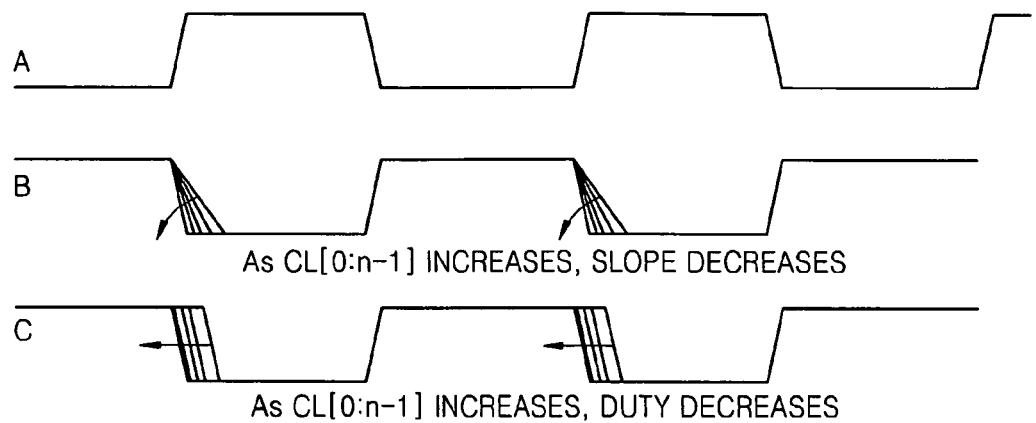
FIG. 5 illustrates waveforms explaining an operation of the duty control circuit of FIG. 4.

FIG. 5 illustrates waveforms explaining an operation of the duty control circuit 100 of FIG. 4. The operation of the duty control circuit 100 of FIG. 4 will now be described with reference to FIG. 5.

When a level of a voltage of the first node "A" falls due to a transition of the input clock signal "CLK1" from logic high to logic low, the "n" number of first switches 121 may be turned off in response to the input clock signal "CLK1." Thus, the ground voltage "VSS" may be cut off from the second node "B" by the slew controller 120, regardless of states of the control signals "CL[0]" through "CL[n−1]."

When the level of the voltage of the first node "A" rises due to a transition of the input clock signal "CLK1" from logic low to logic high, the "n" number of first switches 121 may be turned on in response to the input clock signal "CLK1." The $(n+1)^{th}$ through $2n^{th}$ NMOS transistors "MN2_0" through "MN2_(n−1)" of the "n" number of second switches 122 may be selectively turned on depending on the states of the control signal "CL[0]" through "CL[n−1]." Thus, the ground voltage "VSS" may be provided to the second node "B" through the second switches 122 of the "n" number of second switches 122 that have selectively turned on. As described above, the "n" number of first switches 121 may have different sizes, e.g., different areas, and the "n" number of second switches 122 may have different sizes, such that on-resistance changes in a predetermined manner from switch to switch.

When the input clock signal "CLK1" transitions from logic low to logic high, and the "n" number of first switches 121 are turned on, the falling slew rate of the second node "B" may be controlled in response to the states of the "n" number of control signals "CL[0]" through "CL[n−1]." For example, if values of the "n" number of control signals "CL[0]" through "CL[n−1]" are "000 . . . 00," all of the $(n+1)^{th}$ through $2n^{th}$ NMOS transistors "MN2_0" through "MN2_(n−1)" may be turned off. Thus, the falling slew rate of the second "B" may be decreased. The clock output unit 130 may buffer the voltage of the second node "B" and generate the buffered voltage as the output clock signal "CLK2." Like the waveform of the third node "C" shown in FIG. 5, the duty of the output clock signal "CLK2" may be increased with the decrease in the falling slew rate of the second node "B."

When the values of the "n" number of control signals "CL[0]" through "CL[n−1]" are "111 . . . 11," all of the $(n+1)^{th}$ through $2n^{th}$ NMOS transistors "MN2_0" through "MN2_(n−1)" may be turned on. Thus, the falling slew rate of the second node "B" may increase, and the duty of the output clock signal "CLK2" may be decreased.

According to the characteristics of the duty control circuit 100 shown in FIGS. 4 and 5, the falling slew rate of the second node "B" may be varied according to numbers of "${2}^{\{n\}}$." Therefore, as the values of the "n" number of control signals "CL[0]" through "CL[n−1]" increase from "000 . . . 00" to "111 . . . 11," the falling slew rate of the second node "B" may be gradually increased, and the duty of the output clock signal "CLK2" may be decreased as $2^{n-1}$ steps.

Figure 6:
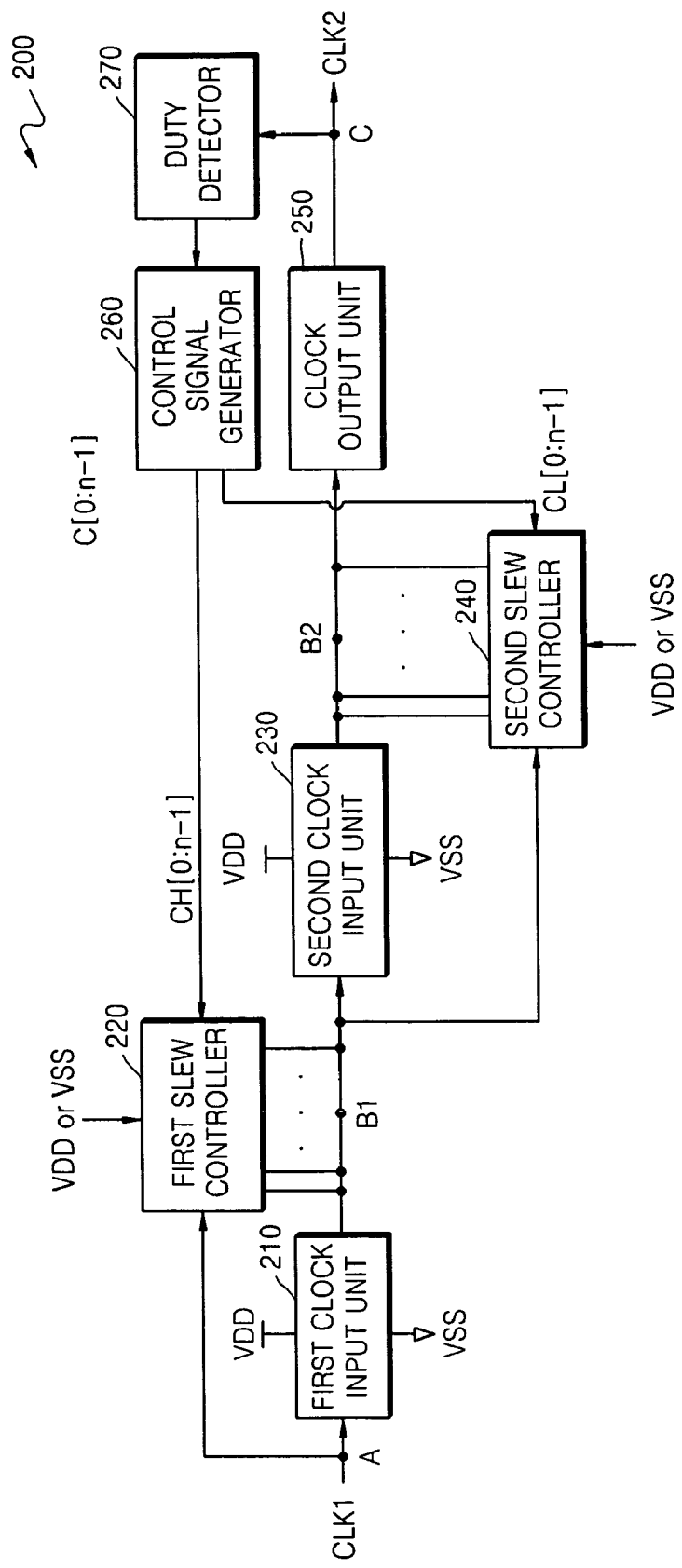
FIG. 6 illustrates a block diagram of a duty control circuit according to a second embodiment.

FIG. 6 illustrates a block diagram of a duty control circuit 200 according to a second embodiment. Referring to FIG. 6, the duty control circuit 200 may include a first clock input unit 210, a first slew controller 220, a second clock input unit 230, a second slew controller 240, and a clock output unit 250. The duty control circuit 200 may further include a control signal generator 260 and a duty detector 270. The elements of the duty control circuit 200 that are the same as those of the elements of the duty control circuit 100 of FIG. 1 may perform similar operations to the elements of the duty control circuit 100, and thus details thereof will not be repeated.

The first clock input unit 210 may receive the input clock signal "CLK1" through a first node "A," may buffer or invert the input clock signal "CLK1," and may provide the buffered or inverted input clock signal "CLK1" to a second node "B1." The first clock input unit 210 may include an inverter, may provide the power voltage "VDD" to the second node "B1" in response to a falling transition of the input clock signal "CLK1," and may provide the ground voltage "VSS" to the second node "B1" in response to a rising transition of the input clock signal "CLK1."

The first slew controller 220 may be electrically connected to the power voltage "VDD" or the ground voltage "VSS," and may provide the power voltage "VDD" or the ground voltage "VSS" to the second node "B1" in response to the first control signal "CH[0:n−1]." For example, if the first slew controller 220 is electrically connected to the power voltage "VDD," the first slew controller 220 may include a plurality of first switches that are arranged in parallel between the power voltage "VDD" and the second node "B1." The first switches may be selectively switched in response to the first control signal "CH[0:n−1]," and the power voltage "VDD" may thus be provided to the second node "B1" through the first switches that have been selectively switched on.

The second clock input unit 230 may receive a signal of the second node "B1" and transmit a signal to a third node "B2" in response to the signal of the second node "B1." For example, the second clock input unit 230 may receive the signal of the second node "B1," may invert or buffer the signal of the second node "B1," and may output the inverted or buffered signal to the third node "B2." The second clock input unit 230 may include an inverter that receives the signal of the second node "B1," inverts the signal of the second node "B1," and outputs the inverted signal.

The second slew controller 240 may be electrically connected to the power voltage "VDD" or the ground voltage "VSS," and may provide the power voltage "VDD" or the ground voltage "VSS" to the third node "B2" in response to the second control signal "CL[0:n−1]." The first slew controller 220 may be electrically connected to the power voltage "VDD" and the second slew controller 240 may be electrically connected to the ground voltage "VSS." The second slew controller 240 may includes a plurality of second switches that are arranged in parallel between the ground voltage "VSS" and the third node "B2." The second switches may be selectively switched in response to the second control signal "CL[0:n−1]," and the ground voltage "VSS" may be provided to the third node "B2" through the second switches that have been selectively switched on.

The clock output unit 250 may receive a signal of the third node "B2," may buffer or invert the signal of the third node "B2," and may output the buffered or inverted signal. The clock output unit 250 may generate the buffered or inverted signal as the output clock signal "CLK2" having a controlled duty. The control signal generator 260 may generates the first control signal "CH[0:n−1]" for controlling operations of the plurality of first switches of the first slew controller 220 and may generate the second control signal "CL[0:n−1]" for controlling operations of the plurality of second switches of the second slew controller 240.

A duty of the output clock signal "CLK2" generated by the clock output unit 250 may be detected, and the first and second control signals "CH[0:n−1]" and "CL[0:n−1]" may be appropriately controlled according to the detection result. For example, the duty detector 270 may receive the output clock signal "CLK2" from a fourth node "C" connected to an output port of the clock output unit 250, may detect the duty of the output clock signal "CLK2," and may provide the detection result to the control signal generator 260. The control signal generator 260 may vary values of the first and second control signals "CH[0:n−1]" and "CL[0:n−1]" based on the detection result of the duty.

Figure 7:
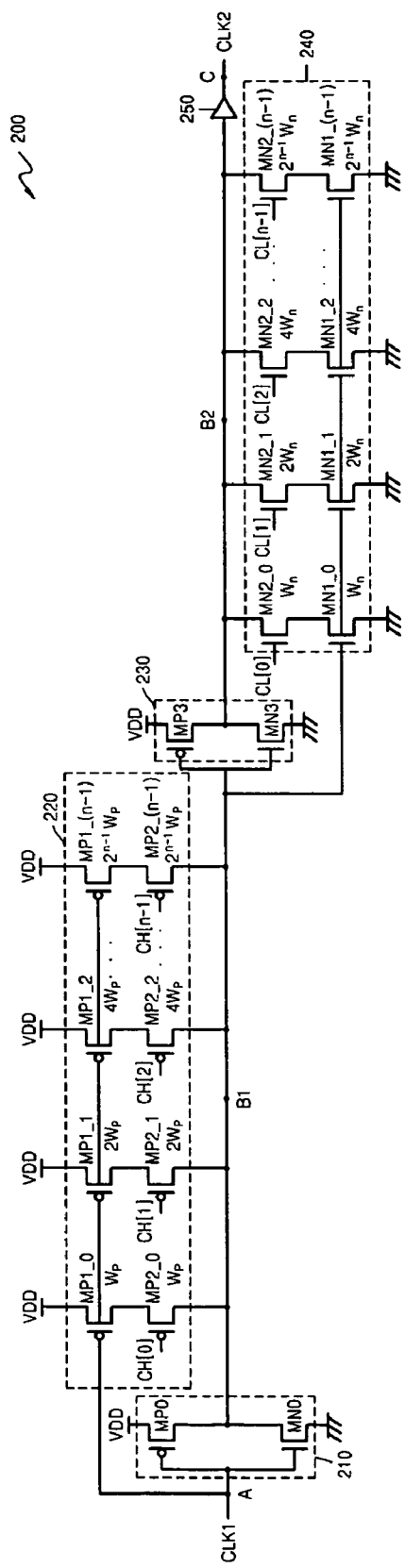
FIG. 7 illustrates a circuit diagram of the duty control circuit of FIG. 6.

A detailed operation of the duty control circuit 200 having the above-described structure will now be described with reference to FIGS. 7 and 8. FIG. 7 illustrates a circuit diagram of the duty control circuit 200 of FIG. 6, and FIGS. 8A and 8B illustrate waveforms explaining an operation of the duty control circuit 200 of FIG. 6. In particular, in this embodiment, the first slew controller 220 may control a rising slew rate of a voltage of the second node "B1," and the second slew controller 240 may control a falling slew rate of a voltage of the third node "B2." However, this embodiment is not limited thereto. According to another aspect of this embodiment, the first slew controller 220 may control a falling slew rate of the voltage of the second node "B1," and the second slew controller 240 may control a rising slew rate of the voltage of the third node "B2."

As shown in FIG. 7, the first slew controller 220 may include first through $n^{th}$ PMOS transistors "MP1_0" through "MP1_(n−1)" and $(n+1)^{th}$ through $2n^{th}$ PMOS transistors "MP2_0" through "MP2_(n−1)." The first through $n^{th}$ PMOS transistors "MP1_0" through "MP1_(n−1)" may have different sizes, and the $(n+1)^{th}$ through $2n^{th}$ PMOS transistors "MP2_0" through "MP2_(n−1)" may have different sizes. For example, areas of the first through $n^{th}$ PMOS transistors "MP1_0" through "MP1_(n−1)" may respectively have values of "W," "2W," "4W," . . . , and "$2^{n-1}$W," and areas of the $(n+1)^{th}$ through $2n^{th}$ PMOS transistors "MP2_0" through "MP2_(n−1)" may respectively have values of "W," "2W," "4W," . . . , and "$2^{n-1}$W."

When the input clock signal "CLK1" transitions from logic high to logic low, the first through $n^{th}$ PMOS transistors "MP1_0" through "MP1_(n−1)" may operate and may all be turned on in response to the input clock signal "CLK1." The $(n+1)^{th}$ through $2n^{th}$ PMOS transistors "MP2_0" through "MP2_(n−1)" may operate respectively in response to an "n" number of first control signals "CH[0:n−1]" and may be selectively turned on, individually or in combination, in response to states of the first control signals "CH[0:n−1]." For example, if values of the first control signals "CH[0:n−1]" are "000 . . . 00," all of the $(n+1)^{th}$ through $2n^{th}$ PMOS transistors "MP2_0" through "MP2_(n−1)" may be turned on. If the values of the first control signals "CH[0:n−1]" are "111 . . . 11," all of the $(n+1)^{th}$ through $2n^{th}$ PMOS transistors "MP2_0" through "MP2_(n−1)" may be turned off.

The rising slew rate of the voltage of the second node "B1" may be controlled through a control of the values of the first control signals "CH[0:n−1]." For example, the rising slew rate of the voltage of the second node "B1" may be controlled in $2^{n-1}$ steps of through a control of the values of the first control signals "CH[0:n−1]" from "000 . . . 00" to "111 . . . 11." If the voltage of the second node "B1" is provided as the output clock signal "CLK2" through the second clock input unit 230 having the inverter and the clock output unit 250 having the buffer, the values of the first control signals "CH[0:n−1]" may increase from "000 . . . 00" to "111 . . . 11." Thus, the duty of the output clock signal "CLK2" may be gradually increased. For example, the first control signals "CH[0:n−1]" having the values of "000 . . . 00" may be generated in an initial operation of a semiconductor device including the duty control circuit 200, and the values of the first control signals "CH[0:n−1]" may be gradually increased. Thus, the duty of the output clock signal "CLK2" may be gradually increased.

The voltage of the second node "B1" may be provided as an input signal of the second clock input unit 230, and the second clock input unit 230 may invert the voltage of the second node "B1" and output the inverted voltage to the third node "B2." The second slew controller 240 may include first through $n^{th}$ NMOS transistors "MN1_0" through MN1_(n−1)" and (n+1)$^{th}$ through $2n^{th}$ NMOS transistors "MN2_0" through MN2_(n−1)."

When the voltage of the second node "B1" transitions from logic low to logic high, the first through $n^{th}$ NMOS transistors "MN1_0" through "MN1_(n−1)" may operate and may all be turned on in response to the voltage of the second node "B1." The (n+1)$^{th}$ through $2n^{th}$ NMOS transistors "MN2_0" through "MN2_(n−1)" may operate respectively in response to an "n" number of second control signals "CL[0:n−1]" and may be selectively turned on in response to states of the "n" number of second control signals "CL[0:n−1]."

The falling slew rate of a voltage of the third node "B2" may be controlled through a control of values of the "n" number of second control signals "CL[0:n−1]." For example, the falling slew rate of the voltage of the third node "B2" may be controlled in $2^{n-1}$ steps through a control of the values of the "n" number of second control signals "CL[0:n−1]" from "000 . . . 00" to "111 . . . 11." If the values of the "n" number of second control signals "CL[0:n−1]" are "000 . . . 00," all of the (n+1)$^{th}$ through $2n^{th}$ NMOS transistors "MN2_0" through "MN2_(n−1)" may be turned off. Thus, the falling slew rate of the voltage of the third node "B2" may be decreased, and the duty of the output clock signal "CLK2" may be increased. If the values of the "n" number of second control signals "CL[0:n−1]" are "111 . . . 11," all of the (n+1)$^{th}$ through $2n^{th}$ NMOS transistors "MN2_0" through "MN2_(n−1)" may be turned on. Thus, the falling slew rate of the voltage of the third node "B2" may be increased, and the duty of the output clock signal "CLK2" may be decreased.

The "n" number of second control signals "CL[0:n−1]" having the values "000 . . . 00" may be generated in an initial operation of a semiconductor device having the duty control circuit 200, and the values of the "n" number of second control signals "CL[0:n−1]" may be gradually increased. Thus, the duty of the output clock signal "CLK2" may be gradually decreased.

Figure 8A:
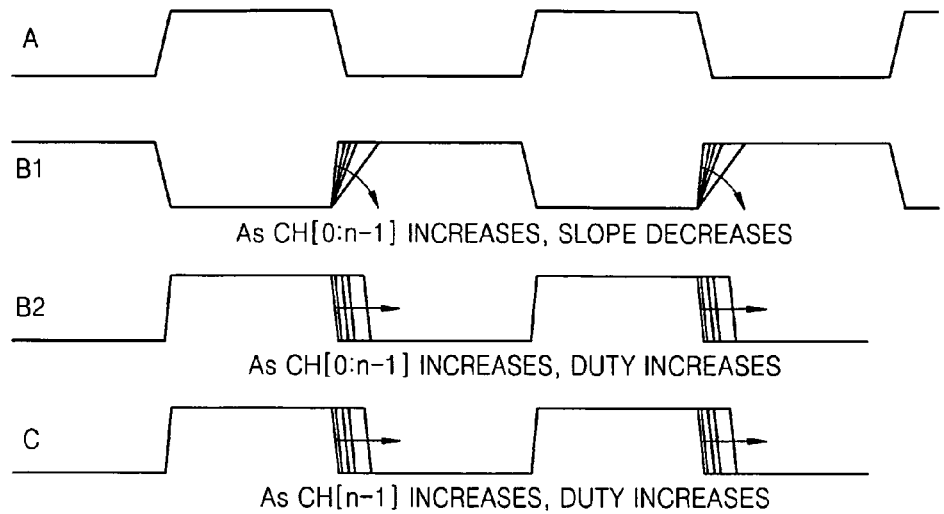
FIGS. 8A and 8B illustrate waveforms explaining an operation of the duty control circuit of FIG. 6.
Figure 8B:
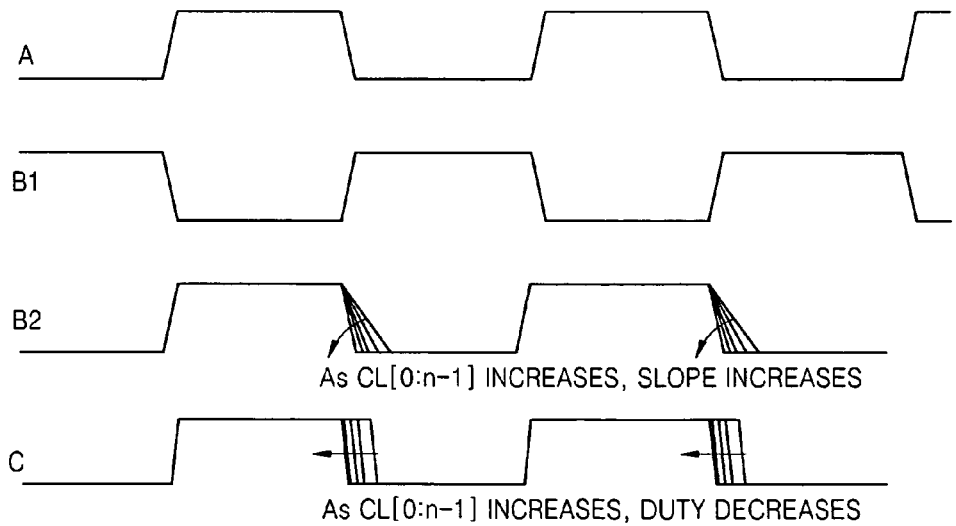

FIG. 8A illustrates the operation of the duty control circuit 200 using the first slew controller 220, and FIG. 8B illustrates the operation of the duty control circuit 200 using the second slew controller 240. As shown in FIG. 8A, as the first control signals "CH[0:n−1]" increase from "000 . . . 00" to "111 . . . 11," the rising slew rate of the voltage of the second node "B1" gradually decreases. As the rising slew rate of the voltage of the second node "B1" decreases, the duty of the output clock signal "CLK2" corresponding to an inverted value of the voltage of the second node "B1" gradually increases.

As shown in FIG. 8B, as the second control signals "CL[0:n−1]" increase from "000 . . . 00" to "111 . . . 11," the falling slew rate of the voltage of the third node "B2" gradually increases. As the falling slew rate of the voltage of the third node "B2" increases, the duty of the output clock signal "CLK2" corresponding to a buffered value of the voltage of the third node "B2" gradually decreases.

As described above, the duty control circuit 200 of FIG. 6 has a combination structure of first and second duty control circuits, wherein the first duty control circuit corresponds to the duty control circuit 100 shown in FIG. 2, and the second duty control circuit corresponds to the duty control circuit 100 shown in FIG. 4. A clock output unit of the first duty control circuit and a clock input unit of the second duty control circuit may be realized as inverters. Thus, the second clock input unit 230 of FIG. 6 may be shared by the first and second duty control circuits.

The duty control circuit 200 of FIG. 6 may be employed to programmably increase or decrease a duty of a clock signal. For example, the first control signals "CH[0:n−1]" and the second control signals "CL[0:n−1]" have values of "000 . . . 00" in an initial operation of a semiconductor device including the duty control circuit 200. The duty of the clock signal may increase with gradual increases in the values of the first control signals "CH[0:n−1]." The duty of the clock signal may decrease with gradual increases in the values of the second control signals "CL[0:n−1]."

Using the duty control circuit 200 having the above-described structure, the duty of the clock signal may be precisely controlled through controls of the first and second control signals "CH[0:n−1]" and "CL[0:n−1]." Also, the duty of the clock signal may be programmably controlled in a large number of steps, i.e., with a high degree of granularity. As illustrated with reference to FIGS. 8A and 8B, a rising edge of an output clock signal does not vary in any case of an increase or a decrease in a duty of the output clock signal. Therefore, variations in clock latency in a semiconductor device including a duty control circuit as described above, which are caused by a control of a duty, may be avoided.

Example embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A duty control circuit configured to control duty of a clock signal, the duty control circuit comprising:
   a clock input unit connected to a first node and a second node, the clock input unit receiving an input clock signal through the first node and changing a voltage of the second node to one of a first voltage level and a second voltage level in response to respective low and high logic levels of the input clock signal;
   a slew controller connected to the second node, the slew controller including one or more switches controlled by respective control signals, the one or more switches providing one of the first voltage level and the second voltage level to the second node in response to the control signals such that a slew rate of a signal at the second node is varied; and
   a clock output unit, the clock output unit outputting an output clock signal having a duty that varies in accordance with the slew rate of the signal at the second node, wherein the slew controller includes:
      an "n" (where "n" is a positive integer) number of first switches that include first electrodes receiving a same one of the first voltage level or the second voltage level, the first switches being controlled by the input clock signal; and
      an "n" number of second switches that are connected between second electrodes of the "n" number of first switches and the second node, and which selectively connect the second electrodes of the "n" number of first switches to the second node, each of the "n" number of second switches being switched on in response to a corresponding control signal so as to provide the same one of the first voltage level or the second voltage level to the second node.

2. The duty control circuit as claimed in claim 1, wherein the clock input unit includes an inverter that inverts the input clock signal received through the first node and outputs an inverted signal to the second node.

3. The duty control circuit as claimed in claim 2, wherein:
the first voltage level is provided by a power voltage source, and
the second voltage level is provided a ground voltage source.

4. The duty control circuit as claimed in claim 1, wherein:
the "n" number of first switches include respective $1^{st}$ through $n^{th}$ PMOS transistors that are arranged in parallel and are switched in response to the input clock signal; and
the "n" number of second switches include respective $(n+1)^{th}$ through $2n^{th}$ PMOS transistors that are respectively connected to the $1^{st}$ through $n^{th}$ PMOS transistors, the $(n+1)^{th}$ through $2n^{th}$ PMOS transistors being switched respectively in response to $1^{st}$ through $n^{th}$ control signals.

5. The duty control circuit as claimed in claim 4, wherein:
the $1^{st}$ through $n^{th}$ PMOS transistors have sizes that are different from one another,
the $(n+1)^{th}$ through $2n^{th}$ PMOS transistors have sizes respectively corresponding to the different sizes of the $1^{st}$ through $n^{th}$ PMOS transistors, and
the slew controller controls a rising slew rate of the signal at the second node in response to the $1^{st}$ through $n^{th}$ control signals.

6. The duty control circuit as claimed in claim 1, wherein:
the "n" number of first switches include respective $1^{st}$ through $n^{th}$ NMOS transistors that are arranged in parallel and are switched in response to the input clock signal; and
the "n" number of second switches include respective $(n+1)^{th}$ through $2n^{th}$ NMOS transistors that are respectively connected to the $1^{st}$ through $n^{th}$ NMOS transistors, the $(n+1)^{th}$ through $2n^{th}$ NMOS transistors being switched respectively in response to $1^{st}$ through $n^{th}$ control signals.

7. The duty control circuit as claimed in claim 6, wherein:
the $1^{st}$ through $n^{th}$ NMOS transistors have sizes that are different from one another, the $(n+1)^{th}$ through $2n^{th}$ NMOS transistors have sizes respectively corresponding to the different sizes of the $1^{st}$ through $n^{th}$ NMOS transistors, and
the slew controller controls a falling slew rate of the signal at the second node in response to the $1^{st}$ through $n^{th}$ control signals.

8. The duty control circuit as claimed in claim 1, further comprising a control signal generator, wherein:
the control signal generator generates the control signals,
the control signal generator provides control signals to the slew controller so as to control the slew rate of the signal at the second node, and
the clock output unit receives the signal from the second node and generates the output clock signal.

9. The duty control circuit as claimed in claim 8, further comprising a duty detector that receives the output clock signal, detects the duty of the output clock signal, and provides a detection result to the control signal generator so that the slew rate of the signal at the second node is controlled in response to the duty of the output clock signal.

10. A duty control circuit configured to control duty of a clock signal, the duty control circuit comprising:
a first clock input unit connected to a first node and a second node, the first clock input unit receiving an input clock signal from the first node and transmitting a first signal to the second node in response to the input clock signal;
a first slew controller connected to the second node and having a plurality of first switches receiving a first voltage level, the plurality of first switches being selectively switched in response to a plurality of first control signals so as to transmit the first voltage level to the second node through the first switches that have been selectively switched, such that a rising slew rate of the first signal at the second node is varied;
a second clock input unit connected to the second node and a third node, the second clock input unit receiving the first signal from the second node and transmitting a second signal to the third node in response to the first signal of the second node;
a second slew controller connected to third node and having a plurality of second switches receiving a second voltage level, the plurality of second switches being selectively switched in response to a plurality of second control signals so as to transmit the second voltage level to the third node through the second switches that have been selectively switched, such that a falling slew rate of the second signal at the third node is varied; and
a clock output unit, the clock output unit outputting an output clock signal having a duty that varies in accordance with the rising and falling slew rates of the second signal at the third node.

11. The duty control circuit as claimed in claim 10, further comprising a control signal generator, wherein:
the clock output unit receives the second signal of the third node and generates the output clock signal having a controlled duty; and
the control signal generator generates the first control signals for controlling the rising slew rate of the first signal and the second control signals for controlling the falling slew rate of the second signal.

12. The duty control circuit as claimed in claim 11, further comprising a duty detector connected to a fourth node, the duty detector receiving the output clock signal from the fourth node, detecting the duty of the output clock signal, and providing the detection result to the control signal generator so that a slew rate of the signal at at least one of the second and third nodes is controlled in response to the duty of the output clock signal.

13. A semiconductor device having a duty control circuit that controls a duty of a clock signal, the duty control circuit comprising:
a clock input unit connected to a first node and a second node, the clock input unit receiving an input clock signal through the first node and changing a voltage of the second node to one of a first voltage level and a second voltage level in response to respective low and high logic levels of the input clock signal;
a slew controller connected to the second node, the slew controller including one or more switches controlled by respective control signals, the one or more switches providing one of the first voltage level and the second voltage level to the second node in response to the control signals such that a slew rate of a signal at the second node is varied; and
a clock output unit, the clock output unit outputting an output clock signal having a duty that varies in accordance with the slew rate of the signal at the second node,
wherein:
when the input clock signal transitions from logic high to logic low, the one or more switches are selectively turned on in response to the control signals and provide the first voltage level to the second node, and when the input clock signal transitions from logic low to logic high, the one or more switches are selectively turned on in response to the control signals and provide the second voltage level to the second node.

14. The semiconductor device as claimed in claim 13, wherein:

the one or more switches includes a plurality of switches that are connected in parallel between the power voltage source and the second node.

15. The semiconductor device as claimed in claim 14, wherein:

the plurality of switches include respective PMOS transistors having sizes that are different from one another, and the PMOS transistors are selectively turned on in response to the control signals to provide the first voltage level to the second node so as to control a rising slew rate of the signal at the second node.

16. The semiconductor device as claimed in claim 13, wherein:

the one or more switches include a plurality of switches that are connected in parallel between the ground voltage source and the second node.

17. The semiconductor device as claimed in claim 16, wherein:

the plurality of switches include respective NMOS transistors having sizes that are different from one another, and the NMOS transistors are selectively turned on in response to the control signals to provide the second voltage level to the second node so as to control a falling slew rate of the signal at the second node.

* * * * *